(12) United States Patent
Noguchi et al.

(10) Patent No.: US 7,122,938 B2
(45) Date of Patent: Oct. 17, 2006

(54) SURFACE ACOUSTIC WAVE DEVICE

(75) Inventors: Hitoshi Noguchi, Gunma (JP);
Yoshihiro Kubota, Tokyo (JP)

(73) Assignee: Shin-Etsu Chemical Co., LTD, Tokyo (JP)

( * ) Notice: Subject to any disclaimer, the term of this patent is extended or adjusted under 35 U.S.C. 154(b) by 247 days.

(21) Appl. No.: 10/836,201

(22) Filed: May 3, 2004

(65) Prior Publication Data
US 2005/0001512 A1    Jan. 6, 2005

(30) Foreign Application Priority Data
May 12, 2003    (JP)    ............... 2003-132575

(51) Int. Cl.
*H03H 9/25* (2006.01)
(52) U.S. Cl. ............... 310/313 A; 310/313 R
(58) Field of Classification Search ............ 310/313 A, 310/313 R
See application file for complete search history.

(56) References Cited

U.S. PATENT DOCUMENTS

| | | | | |
|---|---|---|---|---|
| 5,235,236 A | * | 8/1993 | Nakahata et al. | 310/313 R |
| 5,402,029 A | * | 3/1995 | Nakamura et al. | 310/313 R |
| 5,565,724 A | * | 10/1996 | Hachigo et al. | 310/313 A |
| 5,576,589 A | * | 11/1996 | Dreifus et al. | 310/313 A |
| 2002/0168836 A1 | | 11/2002 | Noguchi | |

FOREIGN PATENT DOCUMENTS

| | | |
|---|---|---|
| EP | 0 534 165 A1 | 3/1993 |
| JP | A 2-20910 | 1/1990 |
| JP | A 5-283970 | 10/1993 |

OTHER PUBLICATIONS

Maeda et al., "Growth Behavior of Boron-Doped Diamond in Microwave Plasma-Assisted Chemical Vapor Deposition Using Trimethylboron as the Dopant Source" Diamond and Related Materials, vol. 7, No. 1, pp. 88-95, 1998.

* cited by examiner

*Primary Examiner*—Thomas M. Dougherty
(74) *Attorney, Agent, or Firm*—Oliff & Berridge, PLC

(57) ABSTRACT

There is disclosed a surface acoustic wave device having at least a diamond film, a piezoelectric-material film, and an electrode on a base material wherein all or some part of the diamond film consists of an electroconductive diamond in which a dopant is doped. Thereby, there can be provided a surface acoustic wave device wherein breakage of the substrate due to generation of static electricity can be prevented in a device manufacturing process so that the device manufacture yield can be increased, and electrification can be prevented at the time of real use so that high performance can be maintained for a long time, even if it is a surface acoustic wave device using diamond.

8 Claims, 2 Drawing Sheets

SURFACE ACOUSTIC WAVE DEVICE

BACKGROUND OF THE INVENTION

1. Field of the Invention

The present invention relates to a surface-acoustic-wave (SAW) device using diamond.

2. Description of the Related Art

A SAW device is a device for selecting a specific frequency by impressing a radio frequency signal (RF signal) to an interdigital transducer (IDT) formed on a piezo electric body (a piezoelectric-material film, a piezoelectric-material board) to excite a surface acoustic wave, and converting a propagated signal into RF signal again. It has been widely used as a band pass filter or a resonator, for optical communications, satellite communications, mobile communications or the like, and is a key device for communication. Piezoelectric materials such as crystal, zinc oxide, lithium niobate (LN), lithium tantalate (LT) and the like have been used for a usual SAW device depending on the use.

It is known that an adaptive center frequency $f_0$ of a SAW device is represented as $f_0=V/\lambda$ using a propagation velocity V of a surface acoustic wave and an interdigital transducer period $\lambda$. Then, in order to correspond to a demand for communication with high-frequency, the interdigital transducer period $\lambda$ has been made shorter, i.e., an interdigital transducer pattern has been made finer (for example, see Japanese Patent Application Laid-open (KOKAI) No. 5-283970). However, there have been caused a problem that control of line width becomes difficult as a pattern gets finer and a problem that degradation progresses as a line width gets narrower.

Then, in order to meet a demand for a high-frequency which has rapidly arisen in a recent communication, it has becomes necessary not only to make an interdigital transducer pattern finer but to make a propagation velocity V of a surface acoustic wave higher. Specifically, a high-speed surface acoustic wave has been used with a substrate having a constitution wherein a film of a material with a high elasticity such as sapphire or diamond is formed on a base material, and a piezoelectric-material thin film is formed on the film (for example, see Japanese Patent Application Laid-open (KOKAI) No. 2-20910). Especially, a diamond has the highest elastic constant among the materials, and is only one material which can achieve a propagation velocity (V) of 10,000 m/s or more even when a piezoelectric material is laminated thereon.

However, when a diamond is used for a SAW device, there has been caused a problem that static electricity is generated on a surface of a substrate to break the substrate, in a process of manufacturing the SAW device, resulting in lowering of a device manufacture yield. Moreover, there has been caused a problem also at the time of real use of the produced SAW device, that a surface of the SAW device is charged with a prolonged use. The surface charge may naturally cause short-circuit, may cause a significant defects in process and performance, in relation to a spark discharge, and furthermore may cause even cracks in a SAW device.

SUMMARY OF THE INVENTION

The present invention has been accomplished to solve the above-mentioned problems. An object of the present invention is to provide a surface acoustic wave device wherein breakage of the substrate due to generation of static electricity can be prevented in a device manufacturing process so that the device manufacture yield can be increased, and electrification can be prevented at the time of real use so that high performance can be maintained for a long time, even if it is a surface acoustic wave device using diamond.

To achieve the above mentioned object, the present invention provides a surface acoustic wave device having at least a diamond film, a piezoelectric-material film, and an electrode on a base material wherein all or some part of the above-mentioned diamond film consists of an electroconductive diamond in which a dopant is doped.

As described above, if all or some part of the diamond film consists of the electroconductive diamond in which a dopant is doped, accumulation of a static electricity on a surface of the substrate can be suppressed in a process of manufacturing a SAW device, with keeping outstanding characteristics of high elasticity of diamond. Therefore, breakage of a substrate can be prevented, and a device yield can be raised. Furthermore, electrification on the surface of the SAW device can be prevented also at the time of real use of a SAW device, and high performance can be maintained for a long time.

In this case, the above-mentioned diamond film can be those formed by a vapor phase synthetic method.

As described above, the diamond film can be formed, for example by vapor phase synthetic method. Furthermore, electroconductive property can be easily afforded to it by using a doping gas.

In this case, it is desirable that an electrical resistivity of the above-mentioned electroconductive diamond is $10^{13}$ $\Omega \cdot cm$ or less at 20° C.

As described above, if the electrical resistivity of the electroconductive diamond is $10^{13}$ $\Omega \cdot cm$ or less at 20° C., generation of static electricity can be surely prevented in the manufacturing process of the SAW device, and electrification can also be surely prevented for a long time at the time of real use of the SAW device.

Moreover, it is desirable that the dopant for the above-mentioned electroconductive diamond is boron or phosphorus.

As described above, if the dopant for the electroconductive diamond is boron or phosphorus, the electrical resistivity of the diamond can be controlled easily to a desired electrical resistivity since these dopants can be doped in the diamond comparatively easily.

In this case, it is desirable that the electroconductive diamond which constitutes a part of the above-mentioned diamond film is formed on all the surface or a part of the surface of the diamond film, and a thickness thereof is 20 μm or less.

As described above, if the electroconductive diamond which constitutes a part of the above-mentioned diamond film is formed on all the surface or a part of the surface of the diamond film and a thickness thereof is 20 μm or less, generation of static electricity can be sufficiently prevented, and electrification can be sufficiently prevented for a long time also at the time of real use of the SAW device. Furthermore, since the amount of the dopant doped in order to afford electroconductive property can be reduced, lowering of crystallinity of diamond can be suppressed to the minimum, and there is also an effect of cost reduction.

In this case, it is desirable that the electrical resistivity of the above-mentioned piezoelectric-material film is $10^{14}$ $\Omega \cdot cm$ or less at 20° C.

As described above, if the electrical resistivity of the piezoelectric-material film is $10^{14}$ $\Omega \cdot cm$ or less at 20° C., generation of static electricity can be prevented more certainly in a process of manufacturing a SAW device, and charge accumulation can be suppressed more certainly also at the time of real use of a SAW device.

As explained above, according to the present invention, static electricity accumulation in the SAW device manufacturing process can be suppressed, breakage of a substrate can be prevented and device yield can be improved, by using the electroconductive diamond in which a dopant is doped for all or some part of a diamond film rather than using only an insulating diamond when using a diamond for a SAW device. Moreover, electrification on the surface of the SAW device can be prevented at the time of real use of the produced SAW device, and high performance can be maintained for a long time.

DESCRIPTION OF THE INVENTION AND EMBODIMENT

The present invention will be explained hereafter.

The inventors of the present invention have noted that in the case of a SAW device using an insulating diamond, static electricity is easily generated on a surface of a substrate, during a SAW device manufacturing process, and that the SAW device surface is easily electrified by a pyro-electricity response or piezoelectricity response of piezoelectric material, corresponding to the temperature change of the SAW device or corresponding to a mechanical stress applied to the SAW device at the time of real use of the SAW device.

Then, the inventors of the present invention have studied further and found that it is not effective to use only an insulating diamond for a SAW device, but is effective to use the diamond in which a dopant is doped to afford electroconductive property, in order to prevent generation of static electricity in a device manufacturing process and to prevent electrification for a long time at the time of real use of a device, and thereby, they have completed the present invention.

The embodiments of the present invention will now be described hereafter. However, the invention is not limited thereto.

The surface acoustic wave device of the present invention is that having at least a diamond film, a piezoelectric-material film, and an electrode on a base material wherein all or some part of the above-mentioned diamond film is an electroconductive diamond in which a dopant is doped.

Figure 1:
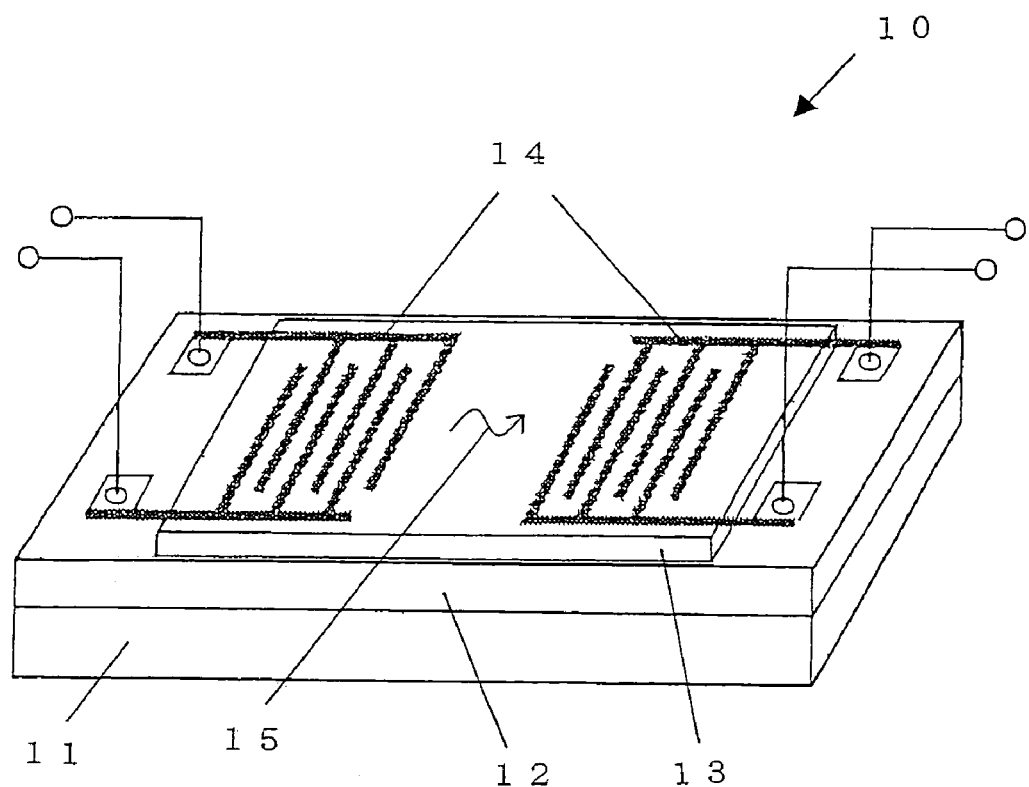
FIG. 1 is a schematic view showing an example of the SAW device of the present invention.

An example of the surface acoustic wave device according to the present invention will be shown in FIG. 1.

The surface acoustic wave device 10 consists of a diamond film 12 and a piezoelectric-material film 13 formed on a base material 11 such as a silicon wafer, and an interdigital transducer 14 made of aluminum or the like formed on the piezoelectric-material film 13. In the present invention, a dopant is doped in all or some part of the diamond films 12 to afford electroconductive property.

The surface acoustic wave device 10 selects a specific frequency in a process of converting a high frequency signal inputted into the left electrode 14 to a surface acoustic wave 15, and again converting to a high frequency signal at the right electrode 14.

As described above, if all or some part of the diamond film consists of the electroconductive diamond in which the dopant is doped, the static electricity accumulation to a surface of a substrate can be effectively suppressed in a process of manufacturing a SAW device, and thus the outstanding characteristics of high elasticity of a diamond can be used efficiently, breakage of a substrate can be prevented and the device manufacture yield can be raised. Furthermore, electrification on the surface of the SAW device can be effectively prevented also at the time of real use of the SAW device, and high performance can be maintained for a long time. In addition, it is advantageous that all of the diamond film consists of the electroconductive diamond in which a dopant is doped, since the film forming process of the diamond film can be simplified, and the film can be formed very easily. However, in order to prevent accumulation of a surface charge and to prevent generation of static electricity, it is sufficient that at least the surface of a diamond film is electroconductive. Therefore, a dopant may be doped in only a surface to afford electroconductive property. It is advantageous, since degradation of quality of the diamond film in the bulk section can be prevented thereby, and a high elasticity can be achieved.

As a method of forming such a diamond film, a vapor phase synthetic method may be exemplified. Here, a method of forming a diamond film according to the vapor phase synthetic method will be explained.

First, in a process of forming a diamond film on a base material, if diamond particles are allowed to exist on the surface of a base-material, a density of nuclear generation of a diamond can be made high, and formation of a vapor-phase synthesized diamond film becomes easy. Accordingly, in order to obtain a continuation film which is uniform even if it is thin, it is effective to perform pretreatment for seeding diamond particles on the surface of a base-material by applying a suspension of diamond on the surface of a base-material, conducting a ultrasonication treatment in a suspension of diamond, conducting a scratch processing with diamond particles, or the like.

The diamond film can be formed on the base material pretreated in such a manner, according to the vapor phase synthetic method which uses as an energy source, for example, DC arc electric discharge, DC glow discharge, combustion flame, radio frequency (RF), microwave, a heat filament, or the like. The microwave CVD and the heat filament CVD are especially preferable, since the diamond film having a large area and good crystallinity can be formed.

The method of forming the diamond film according to the microwave CVD will be explained with reference to the microwave CVD system shown in FIG. 2.

In the microwave CVD system 20, a stage 25 equipped with a heating system such as a heater is located in a chamber 23 equipped with a gas introduction pipe 21 and a gas exhaust pipe 22. A microwave power supply 27 is connected to a microwave introduction aperture 24 through a waveguide 28 so that plasma can be generated in the chamber 23.

In order to form a diamond film using the microwave CVD system 20, the base material 26 on which the diamond film is to be formed is placed on the stage 25 first, and the the chamber 23 is exhausted with a non-illustrated rotary pump to reduce a pressure. Next, a raw material gas (for example, methane+hydrogen) is introduced into the chamber 23 from the gas introduction pipe 21 at a desired flow rate. At this time, it is possible to dope a dopant in a diamond by adding a gas containing a predetermined dopant element (for example, $B(OCH_3)_3$, diborane, phosphine), to the raw material gas. Next, atmosphere in the chamber 23 is controlled to be a predetermined atmospheric pressure by adjusting the bulb of the gas exhaust pipe 22, and then plasma is generated in the chamber 23 by impressing microwave from the microwave power supply 27 and a waveguide 28 to form the diamond film on the base material 26. If the dopant gas is introduced only in the latter half of a CVD reaction, it is possible to afford electroconductive property only to the surface of the diamond film.

Although all or some part of the diamond film formed as mentioned above consists the electroconductive diamond in the surface acoustic wave device of the present invention, it is desirable that the electrical resistivity of the electroconductive diamond which is $10^{13}$ Ω·cm or less at 20° C. If the electrical resistivity is in the range, generation of static electricity can be prevented effectively in the process of manufacturing a SAW device, and electrification can be certainly prevented for a long time also at the time of real use of a SAW device.

Moreover, it is desirable that the dopant of the electroconductive diamond is boron or phosphorus. Since these dopants can be doped in diamond comparatively easily, the electrical resistivity of diamond can be controlled easily to a desired electrical resistivity at high accuracy.

What is necessary in order to dope a dopant such as boron, phosphorus or the like, in a diamond in the case that the method of forming a diamond film is microwave CVD is just to add the gas which contains the element of the dopant to the raw material gas as described above.

Moreover, it is also possible to dope a dopant in a diamond after forming a diamond film, according to ion implantation or the like.

Furthermore, a thickness of the diamond film of the surface acoustic wave device of the present invention is desirably in the range of 0.1 μm–40.0 μm. If a thickness of the diamond film is 0.1 μm or more, it can fully function as a SAW device corresponding to high frequency. The thickness of 40.0 μm is enough, and saving of a raw material and shortening of a film forming time can be achieved with maintaining an equivalent performance as compared with the case of being thicker than 40.0 μm. Thereby reduction of cost can be achieved.

Since the problem is that static electricity is generated on the surface of the substrate in the process of manufacturing a SAW device, and that the surface of the device is charged at the time of real use of the SAW device, it is especially efficient and preferable in order to prevent these phenomena that the electroconductive diamond which constitutes a part of a diamond film is formed all the surface or a part of the surface of the diamond film, and has a thickness of 20 μm or less. Since it has electroconductive property at least a part of the surface in that case, it is possible to prevent generation of static electricity in the process of manufacturing a SAW device, and it is fully possible to prevent electrification for a long time at the time of real use of a SAW device. Furthermore, since the amount of the dopant doped in order to afford electroconductive property can be reduced, it is possible to suppress lowering of the crystallinity to the minimum, and therefore high-elasticity can be maintained and cost reduction can be achieved.

Examples of a piezoelectric-material film used for the surface acoustic wave device of the present invention may include: ZnO, LiNbO$_3$, LiTaO$_3$, crystal, or the like.

Especially, the piezoelectric-material film having an electrical resistivity of $10^{14}$ Ω·cm or less at 20° C. is preferable. Because, if the electrical resistivity is in this range, the effect achieved by affording electroconductive property to a diamond can also be added, generation of static electricity can be prevented more certainly in the process of manufacturing a SAW device, and charge accumulation can be more certainly suppressed at the time of real use of a SAW device.

EXAMPLES

Hereafter, the present invention will be explained concretely by Example and Comparative example.

Example 1

A double-side polished single-crystal-silicon wafer with a diameter of 100 mm and a thickness of 2 mm and an orientation <100> was prepared as a base material.

Then, the diamond film was formed on this base material according to a pretreatment process and a film forming process.

At the pretreatment process, the base material was pretreated in order to raise a density of nuclear generation of a diamond.

First, the base material was stuck on the spin coater by vacuum, and 50 ml of a suspension of diamond particles (cluster diamond with a mean particle diameter of 50 nm) was dropped on the surface.

Next, the base material was rotated for 30 seconds at 3000 r.p.m., so that a suspension of diamond particle on the surface might be applied in the uniform state. Then, air drying was carried out and the layer for seeding a diamond was formed on the surface of the base-material.

A diamond film is formed on the pretreated base material at the film forming process after the above-mentioned pretreatment process.

Figure 2:
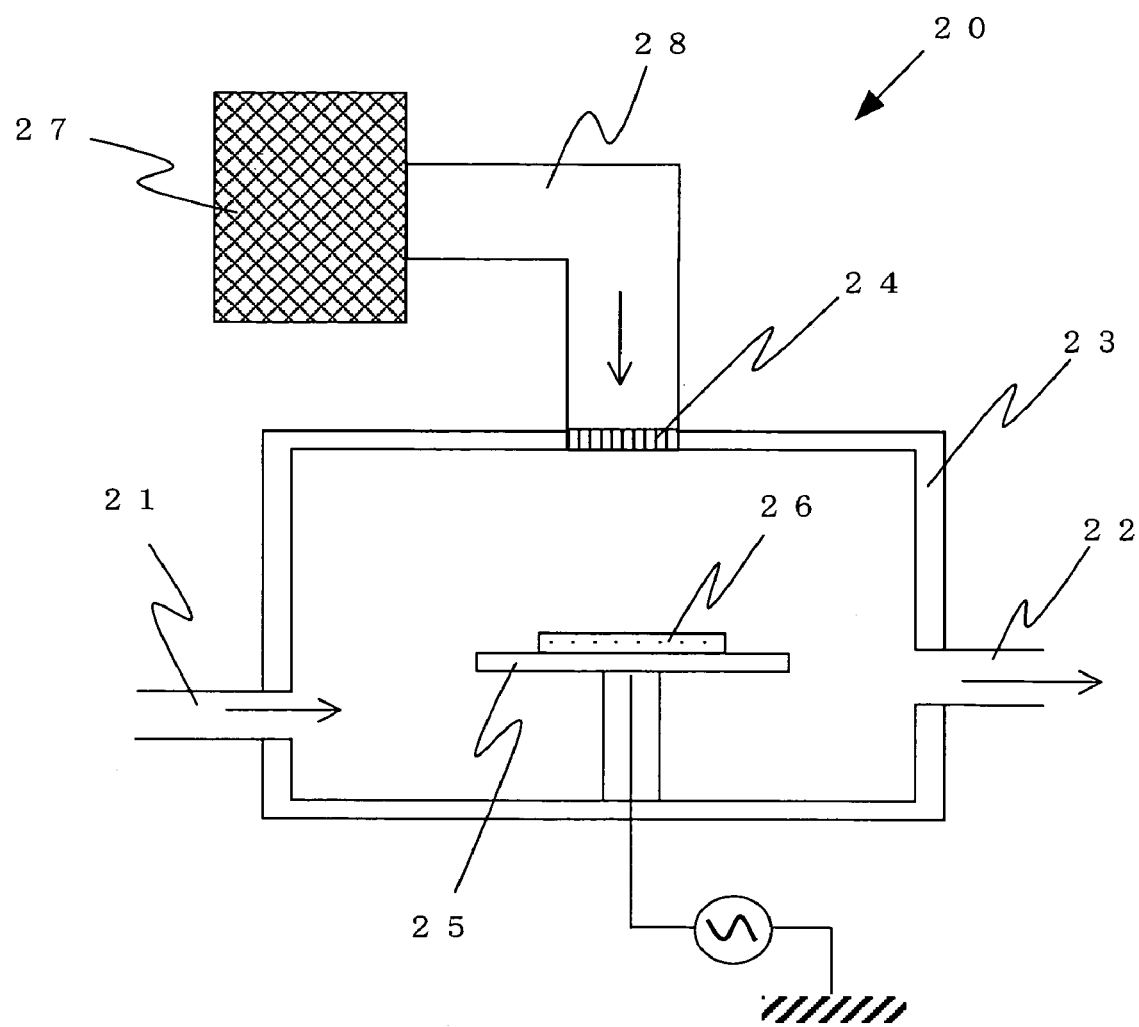
FIG. 2 is a schematic view showing an example of the micro wave CVD apparatus.

First, the base material 26 was set on the stage 25 in the chamber 23 of the microwave CVD system 20 shown in FIG. 2.

Next, after exhausting to be in the state of reduced pressure of $10^{-3}$ Torr or less with a rotary pump, the raw material gas which consists of methane, hydrogen gas, and B(OCH$_3$)$_3$ gas was supplied from the gas introduction pipe 21. Each gas was introduced in the chamber 23 at methane 40.0 sccm, hydrogen gas 940.0 sccm, and B(OCH$_3$)$_3$ gas 20.0 sccm, and at the rate of a volume ratio of methane/hydrogen gas/B(OCH$_3$)$_3$ gas=4.0/94.0/2.0.

Next, the bulb of the gas exhaust pipe 22 was adjusted so that the pressure in a chamber 23 can be 20 Torr(s), the microwave of 3000 W was impressed by the microwave power supply 27 to generate plasma, and a boron doped diamond film was formed over 95 hours. At the time of the film formation, the base material generated heat by microwave absorption, and the temperature of the surface reached to 860° C.

Then, the surface of the boron doped diamond film thus obtained was finished by polishing. After polishing, a thickness of the diamond film was 30 μm, a surface roughness Ra was 3 nm, and the electrical-resistivity value of the diamond film was 0.6 Ω·cm at 20° C. as measured in 35 mm square area at a center.

Furthermore, the ZnO film was formed on this diamond film to the thickness of 1.0 μm by sputtering. The film was formed with R.F. magnetron sputtering apparatus using ZnO as a target.

Then, an aluminum layer which serves as an interdigital transducer was formed to the thickness of 0.2 μm on this ZnO film also by sputtering. The film was formed with the R.F. magnetron sputtering equipment using aluminum as a target.

Then, an aluminum layer was patterned by reactive ion etching at a line breadth of 1 μm, and used as an interdigital transducer. Finally, a device was cut out and packed to produce the SAW device.

Consequently, charge up is not generated and there is no problem of breakage in the substrate in the process of manufacturing a SAW device.

Moreover, when the SAW device which used the boron doped electroconductive diamond manufactured as described above was real-used, it was operated satisfactory at all even at more than 2,000 hours from the beginning of using.

Comparative Example 1

The SAW device was manufactured by the same method as a Example 1 except that, in the film forming process of a diamond film, $B(OCH_3)_3$ which is a source of a boron is not added to a raw material gas. In this case, the electrical resistivity of the diamond film was $2 \times 10^{14}$ Ω·cm.

As a result, charge-up was generated in the substrate and a lot of substrates were damaged in the process of manufacturing a SAW device.

Moreover, when the SAW device was real-used, the spark discharge due to electrification was generated at about 100 hours after the beginning of using, and operation became impossible because of a trouble in the circuit.

It is clear that in the SAW device of Example 1, static electricity accumulation to the surface of the substrate can be suppressed in a SAW device manufacturing process by using the electroconductive diamond in which the dopant was doped, and breakage of the substrate can be prevented as a result.

Moreover, it is clear that, in the SAW device of Example 1, electrification of the surface of the device can be prevented at the time of real use of a SAW device and high performance can be maintained for a quite longer time as compared with the SAW device of Comparative example 1.

The present invention is not limited to the above-described embodiment. The above-described embodiment is a mere example, and those having the substantially same structure as that described in the appended claims and providing the similar action and effects are included in the scope of the present invention.

What is claimed is:

1. A surface acoustic wave device having at least a diamond film, a piezoelectric-material film, and an electrode on a base material wherein all or some part of the diamond film consists of an electroconductive diamond in which a dopant is doped;

wherein an electrical resistivity of the electroconductive diamond is $10^{13}$ Ω·cm or less at 20° C., and wherein the electrical resistivity of the piezoelectric-material film is $10^{14}$ Ω·cm or less at 20° C.

2. The surface acoustic wave device according to claim 1 wherein the diamond film is formed by a vapor phase synthetic method.

3. The surface acoustic wave device according to claim 1 wherein the dopant for the electroconductive diamond is boron or phosphorus.

4. The surface acoustic wave device according to claim 2 wherein the dopant for the electroconductive diamond is boron or phosphorus.

5. The surface acoustic wave device according to claim 1 wherein the electroconductive diamond which constitutes a part of the diamond film is formed on all the surface or a part of the surface of the diamond film, and a thickness thereof is 20 μm or less.

6. The surface acoustic wave device according to claim 2 wherein the electroconductive diamond which constitutes a part of the diamond film is formed on all the surface or a part of the surface of the diamond film, and a thickness thereof is 20 μm or less.

7. The surface acoustic wave device according to claim 3 wherein the electroconductive diamond which constitutes a part of the diamond film is formed on all the surface or a part of the surface of the diamond film, and a thickness thereof is 20 μm or less.

8. The surface acoustic wave device according to claim 4 wherein the electroconductive diamond which constitutes a part of the diamond film is formed on all the surface or a part of the surface of the diamond film, and a thickness thereof is 20 μm or less.

* * * * *